(12) United States Patent
Ishikawa et al.

(10) Patent No.: US 9,733,142 B2
(45) Date of Patent: Aug. 15, 2017

(54) PRESSURE SENSOR, AND SENSOR UNIT PROVIDED WITH SAME

(71) Applicants: KABUSHIKI KAISHA SAGINOMIYA SEISAKUSHO, Tokyo (JP); FUJI ELECTRIC CO., LTD., Kawasaki-shi, Kanagawa (JP)

(72) Inventors: Takuro Ishikawa, Iruma (JP); Yuji Kanai, Saitama (JP); Kazuhiro Matsunami, Matsumoto (JP)

(73) Assignees: KABUSHIKI KAISHA SAGINOMIYA SEISAKUSHO, Tokyo (JP); FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/436,280

(22) PCT Filed: Oct. 15, 2013

(86) PCT No.: PCT/JP2013/006124
§ 371 (c)(1),
(2) Date: Apr. 16, 2015

(87) PCT Pub. No.: WO2014/061263
PCT Pub. Date: Apr. 24, 2014

(65) Prior Publication Data
US 2015/0285703 A1    Oct. 8, 2015

(30) Foreign Application Priority Data
Oct. 17, 2012 (JP) .................................. 2012-230043

(51) Int. Cl.
G01L 19/06 (2006.01)
G01L 9/00 (2006.01)
G01L 19/14 (2006.01)

(52) U.S. Cl.
CPC .......... G01L 19/069 (2013.01); G01L 9/0054 (2013.01); G01L 19/0645 (2013.01);
(Continued)

(58) Field of Classification Search
CPC ............................... G01L 9/0073; G01L 9/00
See application file for complete search history.

(56) References Cited

U.S. PATENT DOCUMENTS 5,025,116 A * 6/1991 Kawakami ........... H05K 1/0218
174/250
5,231,301 A * 7/1993 Peterson ............... G01L 9/0054
257/364
(Continued)

FOREIGN PATENT DOCUMENTS

EP   13847081.0    6/2016
JP   2003-302300   7/2002
(Continued)

OTHER PUBLICATIONS

English Translation of JP 3987386.*
(Continued)

Primary Examiner — Lisa Caputo
Assistant Examiner — Tran M Tran
(74) Attorney, Agent, or Firm — Workman Nydegger

(57) ABSTRACT

When a main body of a sensor chip (1) is in a grounded state, a shield layer (71) constituting a shield electrode formed on a circuit layer (72) is grounded through a resistor (46).

15 Claims, 9 Drawing Sheets

(52) U.S. Cl.
CPC .... *G01L 19/142* (2013.01); *H01L 2924/0002* (2013.01); *H01L 2924/10253* (2013.01); *H01L 2924/3025* (2013.01)

(56) References Cited

U.S. PATENT DOCUMENTS

| | | | | |
|---|---|---|---|---|
| 5,270,493 A * | 12/1993 | Inoue | ................... | H05K 1/0218 174/253 |
| 5,589,810 A * | 12/1996 | Fung | ................... | G01L 9/0055 338/4 |
| 5,632,854 A * | 5/1997 | Mirza | ................... | G01L 9/0042 216/2 |
| 6,229,190 B1 * | 5/2001 | Bryzek | ................ | G01L 9/0042 257/254 |
| 6,278,167 B1 * | 8/2001 | Bever | ................... | G01L 9/0042 257/254 |
| 6,578,426 B2 * | 6/2003 | Imai | ................... | G01L 9/0042 73/715 |
| 6,688,181 B1 * | 2/2004 | Clerc | ................... | G01L 9/0042 361/283.4 |
| 6,745,633 B2 * | 6/2004 | Sasaki | ................... | G01L 19/147 73/727 |
| 6,813,953 B2 * | 11/2004 | Baba | ................... | G01L 19/0645 73/715 |
| 6,877,383 B2 * | 4/2005 | Horie | ................... | G01L 9/0073 73/754 |
| 6,978,681 B2 * | 12/2005 | Sasaki | ................... | G01L 19/142 73/756 |
| 7,159,467 B2 * | 1/2007 | Silverbrook | .......... | G01L 9/0075 73/715 |
| 7,219,554 B2 * | 5/2007 | Fujimoto | ............. | G01L 19/069 257/419 |
| 7,231,830 B2 * | 6/2007 | Otsuka | ................ | G01L 19/0084 73/756 |
| 7,353,711 B2 * | 4/2008 | O'Dowd | ............. | G01L 9/0072 73/718 |
| 7,412,894 B2 * | 8/2008 | Ueyanagi | ........... | G01L 19/0084 73/753 |
| 7,448,278 B2 * | 11/2008 | Hsieh | ................... | G01L 9/0054 438/53 |
| 7,530,276 B2 * | 5/2009 | Sato | ................... | G01L 19/069 361/283.1 |
| 7,622,782 B2 * | 11/2009 | Chu | ................... | B81C 3/001 257/415 |
| 7,707,888 B2 * | 5/2010 | Yoshida | ................ | G01H 11/08 73/35.09 |
| 7,829,960 B2 * | 11/2010 | Takizawa | ............... | G01L 9/008 257/415 |
| 7,849,749 B2 * | 12/2010 | Yamamoto | ........... | G01L 9/0054 73/727 |
| 7,884,432 B2 * | 2/2011 | Zorich | .................. | G01L 9/0055 257/414 |
| 8,065,919 B2 * | 11/2011 | Takeuchi | ............. | G01L 9/0042 438/52 |
| 8,316,533 B2 * | 11/2012 | Suminto | ............... | G01L 9/0042 29/25.35 |
| 8,356,521 B2 * | 1/2013 | Takizawa | ............... | G01L 9/008 73/723 |
| 8,627,559 B2 * | 1/2014 | Suminto | ............... | G01L 9/0042 257/659 |
| 9,181,084 B2 * | 11/2015 | Liu | ...................... | B81C 1/00301 |
| 2006/0053896 A1 * | 3/2006 | Suzuki | ................ | G01L 19/0645 73/756 |
| 2006/0214202 A1 | 9/2006 | Zorich et al. | | |
| 2006/0278012 A1 | 12/2006 | Fujimoto et al. | | |
| 2007/0243654 A1 * | 10/2007 | Stratton | ................ | G01L 9/0042 438/51 |

FOREIGN PATENT DOCUMENTS

| | | | |
|---|---|---|---|
| JP | 2006-329929 | 12/2006 | |
| JP | 2008-190970 | 2/2007 | |
| JP | 3987386 | 10/2007 | |
| JP | 3987386 B2 * | 10/2007 | ............... G01L 9/00 |
| JP | 2012-127793 | 7/2012 | |

OTHER PUBLICATIONS

International Search Report in corresponding Application No. PCT/JP2013/006124 dated Nov. 19, 2013.
International Preliminary Report on Patentability in corresponding Application No. PCT/JP2013/006124 dated May 14, 2015.
Chinese Office Action issued Sep. 18, 2016, in Application No. 201380054448.5.

* cited by examiner

PRESSURE SENSOR, AND SENSOR UNIT PROVIDED WITH SAME

TECHNICAL FIELD

The present invention relates to a pressure sensor provided with a sensor chip, and a sensor unit provided with the pressure sensor.

BACKGROUND ART

A liquid seal type single-chip semiconductor pressure sensor constitutes part of a sensor unit as disclosed in PATENT DOCUMENT 1, for example. The sensor unit is disposed inside a pressure detection chamber to be formed inside a joint portion made of a metal. For example, main elements of the sensor unit comprise: a diaphragm supported inside the joint portion and configured to isolate the above-mentioned pressure detection chamber from a liquid sealing chamber to be described below; the liquid sealing chamber formed below the diaphragm and configured to pool silicone oil as a pressure transmission medium; a sensor chip disposed inside the liquid sealing chamber and configured to detect pressure fluctuation of the silicon oil corresponding to displacement of the diaphragm; a chip mounting member designed to support the sensor chip; hermetic glass designed to seal a circumference of the chip mounting member around a through-hole of a housing; and a terminal group configured to deliver an output signal from the sensor chip and to supply power to the sensor chip.

Regarding the sensor chip described above, there has been proposed a structure as shown in FIG. 10 of PATENT DOCUMENT 1, which comprises: a movable portion (a pressure detection portion) on which multiple pressure detection elements are integrally formed; an electronic circuit integrally formed on a base around the movable portion and electrically connected to the pressure detection elements; an oxide film covering upper surfaces of the movable portion and the base; and a metal thin film covering the entire oxide film except a portion of the oxide film corresponding to the movable portion. The metal thin film is formed by aluminum vapor deposition in order to prevent adverse effects from occurring in the electronic circuit. Also, the reason for constituting the metal thin film to cover the entire oxide film except the portion corresponding to the movable portion is to prevent a deterioration of characteristics of the pressure sensor.

Nowadays, electro-magnetic compatibility (hereinafter also referred to as EMC) with respect to an interfering electromagnetic wave is required of the above-described single-chip semiconductor pressure sensor as well.

CITATION LIST

Patent Literature

PATENT DOCUMENT 1: The specification of Japanese Patent Publication No. 3987386

SUMMARY OF INVENTION

In the above-described sensor chip, when the metal thin film formed by the aluminum vapor deposition is configured to cover the entire oxide film except the portion corresponding to the movable portion, inductance formed by wiring of the metal thin film and a capacitor formed between the metal thin film and a conductive layer, on which an output voltage line for the electronic circuit is formed, may lead to formation of a resonance circuit. In this case, the EMC performance might deteriorate due to noise to be generated by the resonance circuit.

In view of the above-described problem, the present invention aims to provide a pressure sensor and a sensor unit including the same. The pressure sensor and the sensor unit can maintain a good EMC performance and can prevent adverse effects from occurring in an electronic circuit therein.

To achieve the above-described object, a pressure sensor according to the present invention comprises: a sensor chip including a main body that has a movable portion provided with a plurality of pressure detection elements and displaceable in response to a pressure acting on the movable portion and has a fixed portion being continuous with the movable portion, a circuit formed in a first layer to be laminated on the main body and connected to the pressure detection elements through a conductive layer, and a shield layer formed in a second layer to be laminated on the first layer; a capacitor formed between the shield layer and an output voltage line; and a resistor connected between the shield layer and a ground line and having a resistance value greater than or equal to $10\Omega$ and less than or equal to $1\ M\Omega$.

A sensor unit including a pressure sensor according to the present invention comprises: the above-described pressure sensor; a housing configured to accommodate the pressure sensor through use of a sealing material; a diaphragm configured to isolate an inner peripheral portion of the housing from a pressure chamber of which a pressure is to be detected; a pressure transmission medium filled between the diaphragm and the sensor chip of the pressure sensor; and a terminal group to be electrically connected to the circuit in the sensor chip of the pressure sensor.

According to the pressure sensor and the sensor unit including the same of the present invention, the pressure sensor includes the shield layer to be formed on the second layer laminated on the first layer, and the resistor connected between the shield layer and the predetermined electric potential. As a result, it is possible to maintain a good EMC performance and to prevent adverse effects from occurring in the electronic circuit therein.

DESCRIPTION OF EMBODIMENTS

Figure 5:
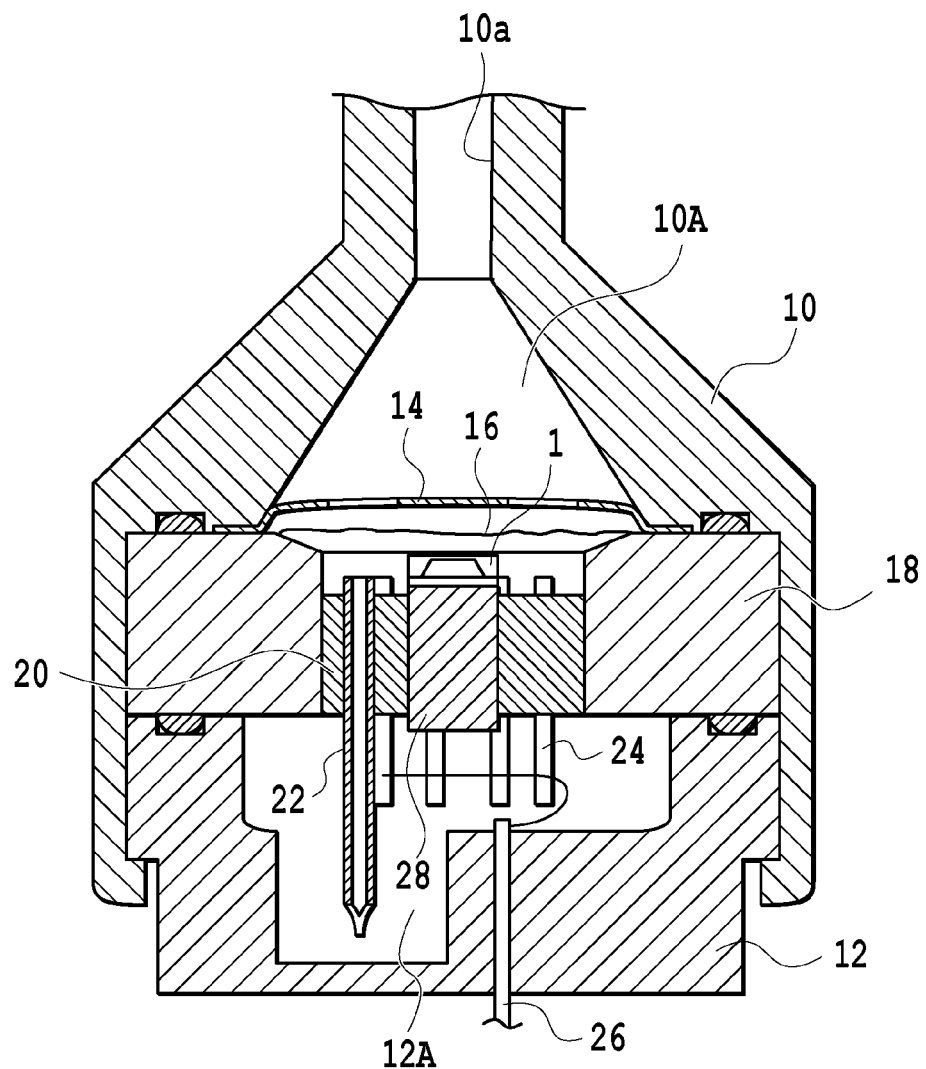
FIG. 5 is a partial cross-sectional view schematically showing a main part of a pressure detection device which is adapted for embodiments of a pressure sensor and a sensor unit including the same according to the present invention.

FIG. 5 schematically shows a substantial part of a pressure detection device which is adapted for a first embodiment and other embodiments described later of a pressure sensor and a sensor unit including the same according to the present invention.

In FIG. 5, the pressure detection device includes a joint unit 10 connected to piping to which a fluid subject to pressure detection is introduced, and a connector unit 12 connected to the joint unit 10 and configured to provide a detection output signal from the joint unit 10 to a given pressure measurement device.

The joint unit 10 has: a fluid introduction passage 10a communicating with the inside of the above-mentioned piping; a pressure chamber 10A formed at one end of the fluid introduction passage 10a with expanding the fluid introduction passage 10a into a conical shape; a sensor accommodating chamber formed into a cylindrical shape adjacent to the pressure chamber 10A and configured to accommodate a sensor unit to be described later; and a connector coupling portion configured to be coupled to an end portion of the connector unit 12.

Air or a liquid serving as the fluid is supplied into the pressure chamber 10A via the fluid introduction passage 10a. Moreover, a diaphragm protection cover 14 provided in the pressure chamber 10A is integrated with the housing 18 so that the diaphragm protection cover 14 pinches an edge portion of a diaphragm 16 to be described later between an end surface of a housing 18 and the diaphragm protection cover and the diaphragm protection cover 14 is welded to the housing 18.

A recessed portion 12A in which to dispose an input-output terminal group 24 and an oil filling pipe 22 to be described later is formed inside one of end portions of the connector unit 12 to be connected to the connector coupling portion of the joint unit 10 described above. In addition, the end portion of the connector unit 12 has a terminal group 26 to be connected to the input-output terminal group 24. The terminal group 26 is connected to the given pressure measurement device.

The sensor unit to be disposed in the sensor accommodating chamber is sandwiched between the one end portion of the connector unit 12 and an inner surface of the sensor accommodating chamber opposed to the one end portion of the connector unit 12 through use of O rings.

As shown in FIG. 5, main elements of the sensor unit configured to detect a pressure inside the pressure chamber 10A and to deliver a detection output signal comprise: the cylindrical housing 18; the diaphragm 16 supported by the one end surface of the housing 18 opposed to the pressure chamber 10A described above and configured to isolate the pressure chamber 10A from an inner peripheral portion of the housing 18; a sensor chip 1 having a plurality of pressure detection elements 32GR1, 32GR2, 32GR3, and 32GR4; a chip mounting member 28 made of a metal and configured to support the sensor chip 1 through a glass layer 80; the input-output terminal group 24 electrically connected to the sensor chip 1; and hermetic glass 20 configured to fix the input-output terminal group 24 and the oil filling pipe 22 between an outer peripheral surface of the chip mounting member 28 and an inner peripheral surface of the housing 18.

In a liquid sealing chamber formed between the sensor chip 1 opposed to the metal diaphragm 16 and an end surface of the hermetic glass 20, a predetermined amount of silicone oil, for example, as a pressure transmission medium is filled through the oil filling pipe 22. Incidentally, one end of the oil filling pipe 22 is closed after the oil is filled. Note that the pressure transmission medium is not limited to the above-mentioned example. For instance, the pressure transmission medium may be any of fluorinated oil that is an inert fluid, fluorinated gel, a fluorinated inert fluid, silicone series gel, and a silicone series inert fluid.

The input-output terminal group 24 comprises two power supply terminals, one output terminal, and five adjustment terminals. Two end portions of each of the terminals project into the liquid sealing chamber and the recessed portion 12A described above, respectively. Note that only four terminals out of eight terminals are illustrated in FIG. 5.

Figure 1A:
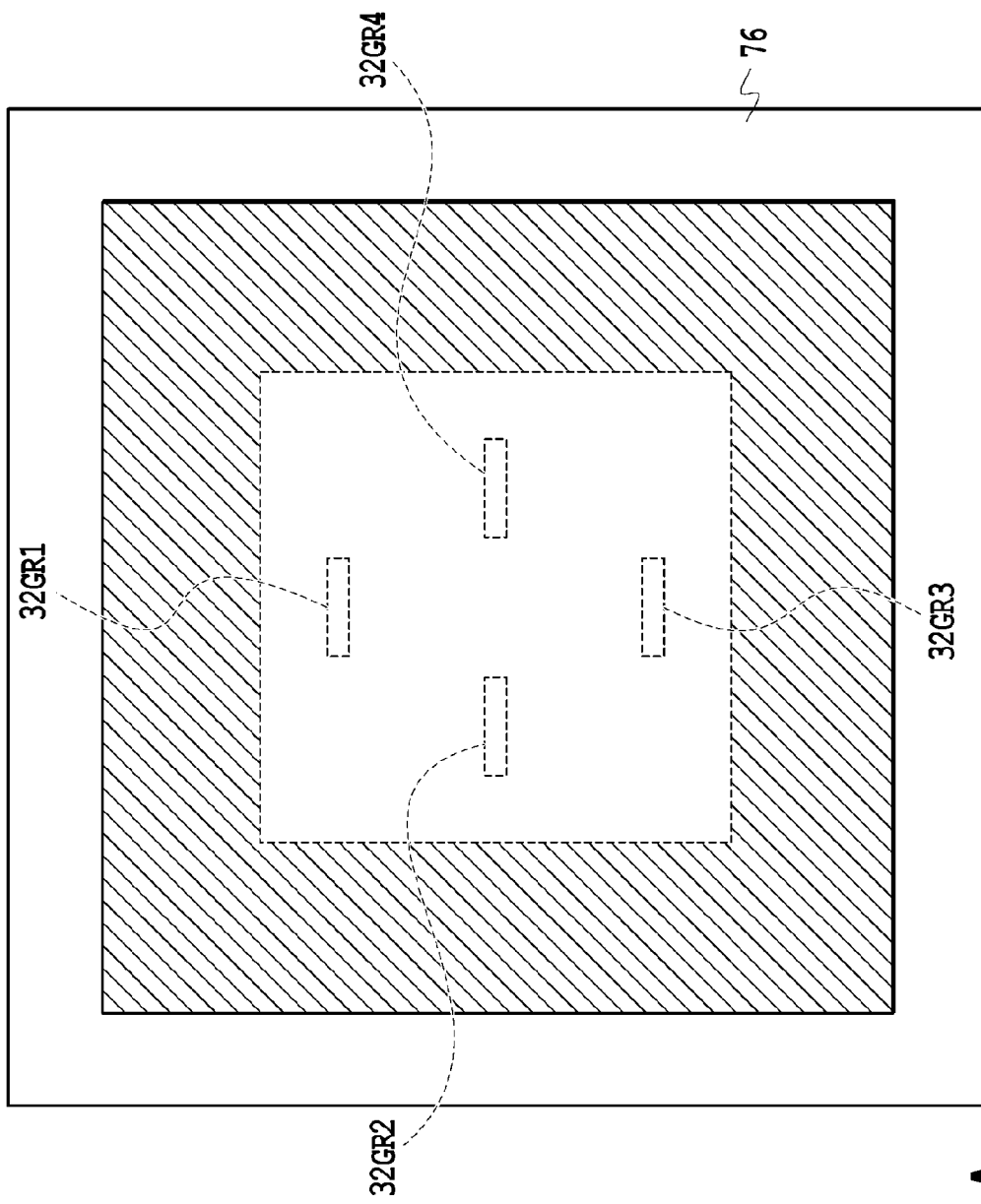
FIG. 1A is a top view showing a sensor chip in a first embodiment of a pressure sensor according to the present invention.
Figure 1B:
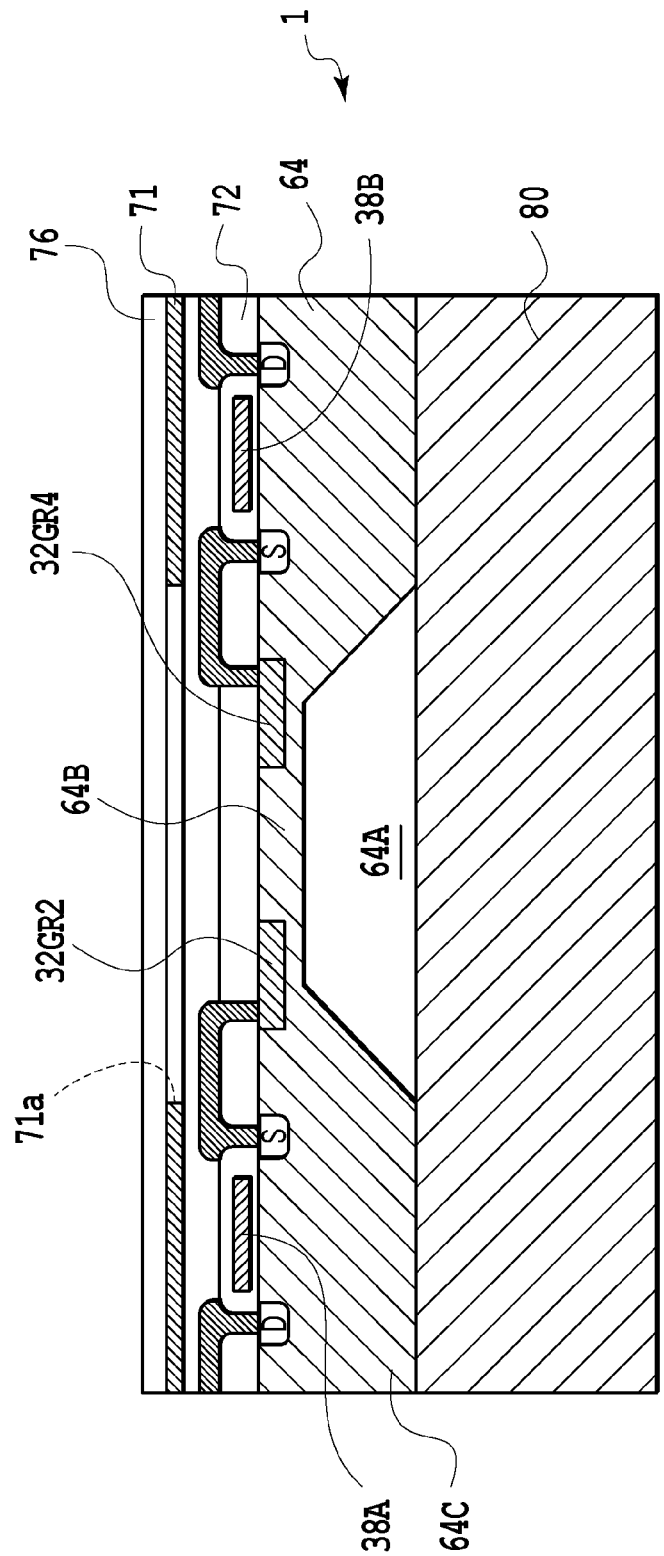
FIG. 1B is a cross-sectional view of FIG. 1A.

As shown in the enlarged view of FIG. 1A and FIG. 1B, the sensor chip 1 is supported by an upper end surface of the chip mounting member 28 through the glass layer 80. The sensor chip 1 comprises: a main body provided with the plurality of pressure detection elements 32GR1, 32GR2, 32GR3, and 32GR4 and formed into a substantially rectangular shape with silicon, for example; a circuit layer 72 which is formed on an upper end surface of the main body and lead to the formation of a processing circuit; an insulation film layer as a second layer to be laminated on an upper surface of the circuit layer 72 that serves as a first layer; a shield layer 71 made of aluminum and formed on the insulation film layer; and a protection layer 76 to protect an upper portion of the shield layer 71.

The main body comprises a fixed portion 64C coming into contact with and being supported by the glass layer 80, and a movable portion 64B. The thin movable portion 64B is integrally formed at a central part of the fixed portion 64C located at a position corresponding to a central part of the above-described diaphragm 16. A recessed portion 64A to be kept at a predetermined degree of vacuum is formed between the movable portion 64B and the glass layer 80. As shown in the enlarged view of FIG. 1A, in the movable portion 64B, the pressure detection elements 32GR1, 32GR2, 32GR3, and 32GR4 are formed at four positions at regular intervals on a common circumference, for example, in such a way as to constitute a Wheatstone bridge circuit. Incidentally, the pressure detection elements 32GR1, 32GR2, 32GR3, and 32GR4 only need to be laid out in such away as to constitute the Wheatstone bridge circuit, and are therefore not limited to the above-mentioned example. For instance, the layouts of the pressure detection elements 32GR1, 32GR2, 32GR3, and 32GR4 do not always have to be disposed at regular intervals on the common circumference.

A circuit including MOSFETs (metal-oxide-semiconductor field effect transistors) comprised of gates 38A and 38B as well as drains and sources made of polysilicon, and the like is formed in the circuit layer 72 in such a way as to be electrically connected to the pressure detection elements 32GR1 to 32GR4 through a conductive layer made of aluminum. Hereby, when a predetermined voltage Vcc is applied between two connection ends, i.e. a connection end between the pressure detection element 32GR1 and the pressure detection element 32GR2 and a connection end between the pressure detection element 32GR3 and the pressure detection element 32GR4, for example, an output voltage Vout proportional to a pressure acting on the movable portion 64B is obtained between two connection ends, i.e. a connection end between the pressure detection element 32GR2 and the pressure detection element 32GR3 and a connection end between the pressure detection element 32GR1 and the pressure detection element 32GR4.

As shown in FIG. 1A, the rectangular shield layer 71 made of aluminum, for example, is formed in a predetermined region (a shaded area) of the above-described insulation film layer located immediately above the conductive layer and the gates 38A and 38B. As shown in FIG. 1B, the shield layer 71 has an opening 71a at a position immediately above the pressure detection elements 32GR1, 32GR2, 32GR3, and 32GR4.

Figure 2:
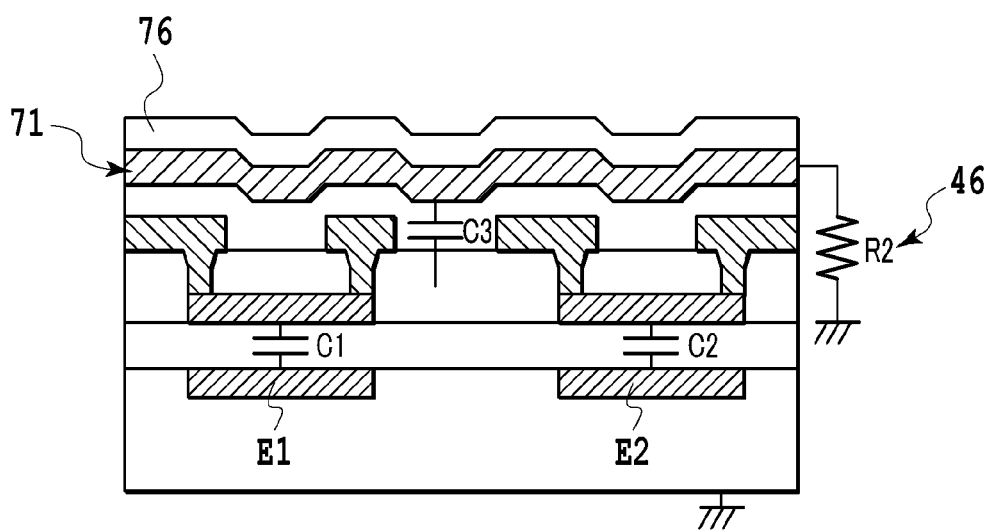
FIG. 2 is a schematic diagram schematically showing a circuit configuration in the example shown in FIG. 1A and FIG. 1B.
Figure 3:
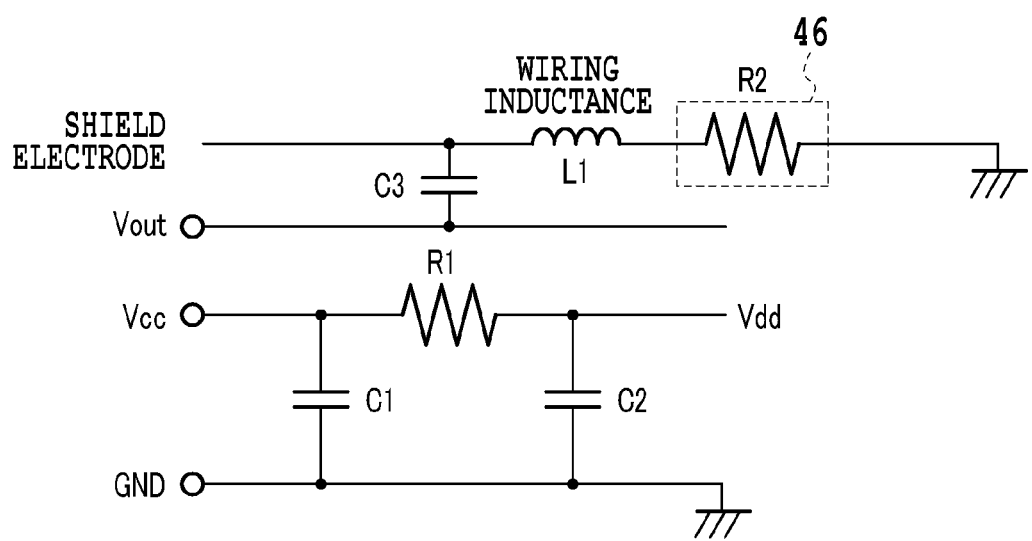
FIG. 3 is a circuit diagram representing an equivalent circuit in the example shown in FIG. 2.
Figure 7:
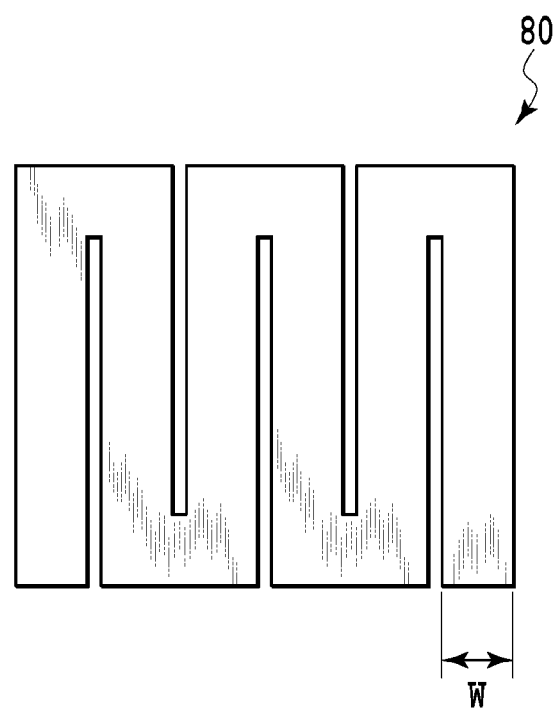
FIG. 7 is a view showing an example of a conductor pattern to be used as a resistor in the example shown in FIG. 2.

As shown in a schematic diagram illustrated in FIG. 2 and an equivalent circuit illustrated in FIG. 3, the shield layer 71 constituting a shield electrode is grounded through a resistor 46. The resistor 46 may be configured as a wiring conductive layer for connecting the shield layer 71 to another region, for example. In that case, a wiring layer may be a resistor made of a material such as polysilicon, which is different from the material of the shield layer 71. Alternatively, the wiring conductive layer may be formed as a conductor pattern 80 as shown in the enlarged view of FIG. 7. The conductor pattern 80 has a predetermined thickness T and a predetermined width W, and is formed into a shape of a rectangular wave by using the same material as the material of the shield layer 71, for example. It is to be noted that the shape of the conductor pattern 80 is not limited to the above-mentioned example and may, of course, be formed into any other shapes such as a fret pattern and a scroll pattern.

Incidentally, FIG. 2 schematically shows a representative relation between the above-described shield electrode and electrodes E1 and E2 that are formed on an aluminum layer forming capacitors C1 and C2. the movable portion 64B and the fixed portion 64C are also grounded.

At that time, a resistance value R2 of the resistor 46 is set to a substantially small value as compared to a resistance value of the above-mentioned silicone oil as the pressure transmission medium. The resistance value R2 of the resistor 46 is set in a range from 10 Ω to 1 MΩ inclusive, for example, or preferably in a range from 1 kΩ to 100 kΩ inclusive. Usually, an attenuation of a signal is determined by a relation between capacitance of a capacitor and a resistance value. When the resistance value R2 is below 1 kΩ, it is not possible to secure a sufficient attenuation for a noise countermeasure if the capacitance of the capacitor is small. Hence, the attenuation of the signal against the noise from outside runs short and as a result, the resistor 46 is unlikely to serve as the noise countermeasure. On the other hand, if the resistance value R2 exceeds 100 kΩ, the aforementioned attenuation of the signal can be secured whereas it is difficult to reduce the chip size because the area of the resistor 46 is increased. As a result, this leads to an increase in manufacturing cost. Due to these reasons, the resistance value R2 of the resistor 46 is set preferably in the range from 1 Ω to 100 Ω inclusive.

When the resistor 46 is the above-described conductor pattern 80, the resistance value R2 (ρ·L/WT) of the conductor pattern 80 as a whole is set in the range from 10 Ω to 1 MΩ inclusive. It is to be noted that, in this relational expression of the resistance value, ρ is resistivity, L is a total length of a belt-like piece, W is a width thereof (see FIG. 7), and T is a thickness thereof. Incidentally, respective values of the resistivity, the total length, the width, and the thickness of the conductor pattern 80 are appropriately selected such that the resistance value R2 falls in the range from 10Ω to 1 MΩ inclusive.

The inventors of the present application have confirmed that the resistor 46 is effective as an EMC countermeasure even in the case where a resonance circuit is formed from wiring of the shield electrode as inductance L1 and a capacitor C3 formed between an output voltage line (the aluminum layer) and the shield electrode as shown in FIG. 3, for example.

Figure 4:
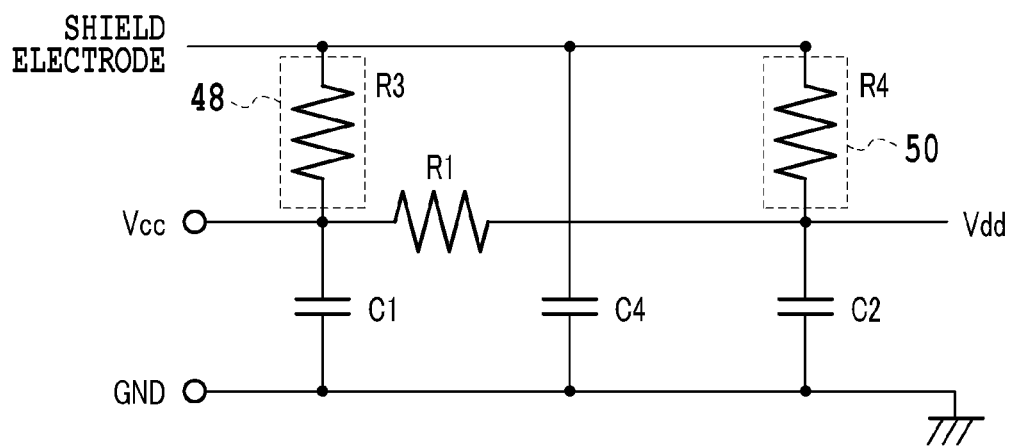
FIG. 4 is a circuit diagram representing another example of an equivalent circuit to be applied to the example shown in FIG. 1A and FIG. 1B.

The aforementioned EMC countermeasure is not limited to this example. In a configuration further including a capacitor C4 formed between the shield electrode and a ground line (GND), resistors 48 and 50 having predetermined resistance values R3 and R4, respectively, may be provided in parallel between an input voltage line and the shield layer 71 that constitutes the shield electrode as shown in FIG. 4, for instance. Each of the resistance values R3 and R4 is set in the range from 10 Ω to 1 MΩ inclusive, for example, or preferably in the range from 1 kΩ to 100 kΩ inclusive. As described previously, the attenuation of the signal is usually determined by the relation between the capacitance of the capacitor and the resistance value. When any of the resistance values R3 and R4 is less than 1 kΩ, it is not possible to secure a sufficient attenuation for the noise countermeasure if the capacitance of the capacitor is small. Hence, the attenuation of the signal against the noise from outside runs short and as a result, the resistor 48 or 50 is unlikely to serve as the noise countermeasure. On the other hand, if any of the resistance values R3 and R4 exceeds 100 kΩ, the aforementioned attenuation of the signal can be secured whereas it is difficult to reduce the chip size because the area of the resistor 48 or 50 is increased. As a result, this leads to an increase in manufacturing cost. By the reasons stated above, each of the resistance values R3 and R4 of the resistors 48 and 50 is set preferably in the range from 1 kΩ to 100 kΩ inclusive.

The inventors of the present application have confirmed that the resistors 48 and 50 are each effective as the EMC countermeasure even in the case where the resonance circuit is formed from the capacitor C4 that is formed between the ground line (GND) and the shield electrode as described above. Note that illustration of the output voltage line is omitted in FIG. 4.

Figure 6A:
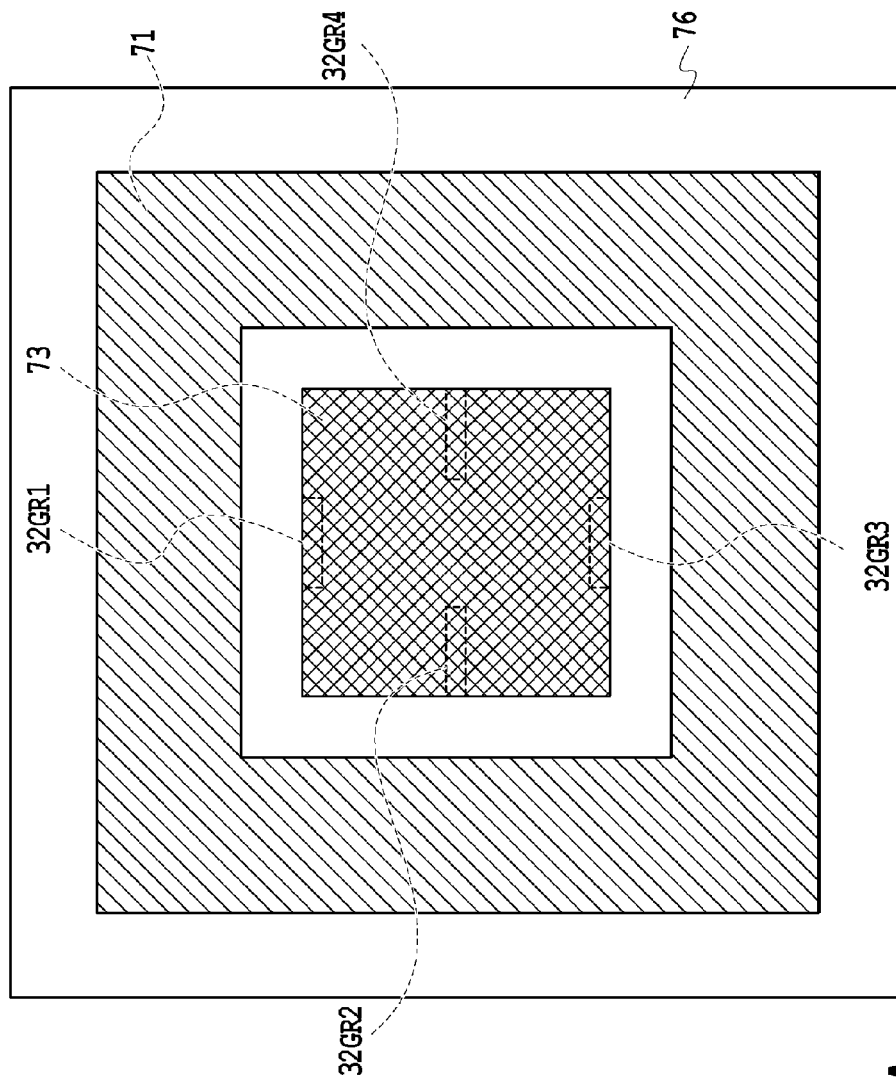
FIG. 6A is a top view of a sensor chip in a second embodiment of a pressure sensor according to the present invention.
Figure 6B:
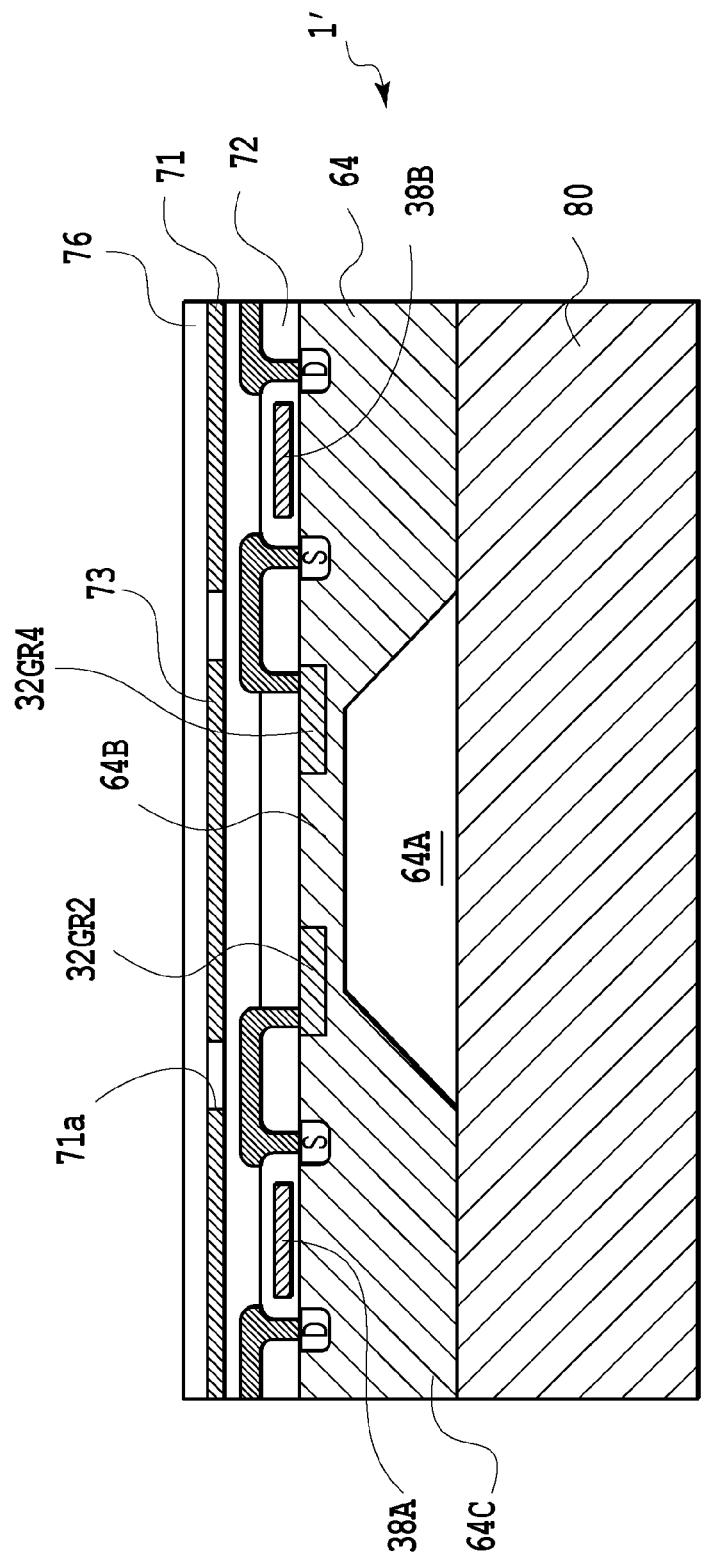
FIG. 6B is a cross-sectional view of FIG. 6A.

A sensor chip 1', which is used in a second embodiment of a pressure sensor and a sensor unit including the same according to the present invention, is schematically illustrated in FIG. 6A and FIG. 6B together with a glass layer.

In the example shown in FIG. 1A and FIG. 1B, the shield layer 71 has the opening 71a at the position immediately above the pressure detection elements 32GR1, 32GR2, 32GR3, and 32GR4. On the other hand, in the example shown in FIGS. 6A and 6B, in addition, a shield layer 73 made of polysilicon is further formed inside the opening 71a at a position immediately above the pressure detection elements 32GR1, 32GR2, 32GR3, and 32GR4.

Incidentally, in FIG. 6A and FIG. 6B, the same constituents as those in the example shown in FIG. 1A and FIG. 1B will be denoted by the same reference signs and overlapping descriptions thereof will be omitted.

As shown in FIG. 6A, for example, the shield layer 73 constituting a shield electrode is formed in a substantially rectangular region (a shaded area) inside the opening 71a of the shield layer 71 and immediately above the pressure detection elements 32GR1, 32GR2, 32GR3, and 32GR4. At that time, the shield layer 73 is formed in such a way as to be located on the substantially common plane inside the opening 71a of the shield layer 71. The shield layer 73 constituting the shield electrode is also grounded through the above-described resistor 46.

Incidentally, the shield layer 73 is not limited to the above-mentioned example. The shield layer 73 does not have to be located in the insulation film layer on substantially common plane with the plane of the shield layer 71, but may instead be formed at a position lower than the aforementioned position.

By forming from polysilicon the shield layer 73 as described above, an ionic impurity contained in the silicon oil as the pressure transmission medium can be prevented from adhering to a portion corresponding to the movable portion and consequently causing a malfunction of the electronic circuit. Moreover, each of the pressure detection elements is in no danger of degradation in sensitivity and linearity. Add to this, each of the pressure detection elements is in no danger of deterioration in temperature characteristic.

The invention claimed is:

1. A pressure sensor comprising:
   a sensor chip comprising:
      a main body comprising:
         a movable portion provided with a plurality of pressure detection elements, the movable portion being adapted to displace in response to a pressure acting thereon; and
         a fixed portion that is continuous with the movable portion;
      a circuit formed in a first layer laminated on the main body, the circuit being connected to the pressure detection elements through a conductive element; and
      a shield layer formed in a second layer laminated on the first layer, the shield layer having an opening extending therethrough directly above the movable portion, the shield layer formed continuously around the opening;
      a capacitor formed between the shield layer and an output voltage line; and
      a resistor connected between the shield layer and a ground line, the resistor having a resistance value greater than or equal to 10Ω and less than or equal to 1 MΩ.

2. The pressure sensor according to claim 1, wherein a shield layer made of aluminum and connected to the resistor is formed in the second layer and above the circuit formed in the first layer.

3. The pressure sensor according to claim 2, wherein a shield layer made of aluminum and connected to the resistor is formed in the second layer at a position immediately above a plurality of semiconductor elements in the circuit to be formed in the first layer.

4. The pressure sensor according to claim 1, wherein the shield layer in the second layer is made of polysilicon, and covers a predetermined region located immediately above the plurality of pressure detection elements.

5. A sensor unit comprising:
   the pressure sensor according to claim 1;
   a housing configured to accommodate the pressure sensor through use of a sealing material;
   a diaphragm configured to isolate an inner peripheral portion of the housing from a pressure chamber of which a pressure is to be detected;
   a pressure transmission medium filled between the diaphragm and the sensor chip of the pressure sensor; and
   a terminal group to be electrically connected to the circuit in the sensor chip of the pressure sensor.

6. A sensor unit comprising:
   the pressure sensor according to claim 1;
   a housing configured to accommodate the pressure sensor through use of a sealing material;
   a diaphragm configured to isolate an inner peripheral portion of the housing from a pressure chamber of which a pressure is to be detected;
   a pressure transmission medium filled between the diaphragm and the sensor chip of the pressure sensor;
   a terminal group to be electrically connected to the circuit in the sensor chip of the pressure sensor, and
   wherein the shield layer is made of aluminum and is connected to the resistor, wherein the shield layer is formed in the second layer and above the circuit formed in the first layer.

7. A sensor unit comprising:
   the pressure sensor according to claim 1;
   a housing configured to accommodate the pressure sensor through use of a sealing material;
   a diaphragm configured to isolate an inner peripheral portion of the housing from a pressure chamber of which a pressure is to be detected;
   a pressure transmission medium filled between the diaphragm and the sensor chip of the pressure sensor;
   a terminal group to be electrically connected to the circuit in the sensor chip of the pressure sensor, and
   wherein the shield layer in the second layer is made of polysilicon, and covers a predetermined region located immediately above the plurality of pressure detection elements.

8. A pressure sensor comprising:
   a sensor chip comprising:
      a main body comprising:
         a movable portion provided with a plurality of pressure detection elements, the movable portion being adapted to displace in response to a pressure acting thereon; and
         a fixed portion that is continuous with the movable portion;
      a circuit formed in a first layer laminated on the main body, the circuit being connected to the pressure detection elements through a conductive element;
      a shield layer formed in a second layer laminated on the first layer, the shield layer having an opening extending therethrough directly above the movable portion, the shield layer formed continuously around the opening;
      a capacitor formed between the shield layer and a ground line; and
      a resistor connected between the shield layer and an input voltage line, the resistor having a resistance value greater than or equal to 10Ω and less than or equal to 1 MΩ.

9. A sensor unit comprising:
   the pressure sensor according to claim 8;
   a housing configured to accommodate the pressure sensor through use of a sealing material;
   a diaphragm configured to isolate an inner peripheral portion of the housing from a pressure chamber of which a pressure is to be detected;
   a pressure transmission medium filled between the diaphragm and the sensor chip of the pressure sensor; and
   a terminal group to be electrically connected to the circuit in the sensor chip of the pressure sensor.

10. The pressure sensor according to claim 8, wherein a shield layer made of aluminum and connected to the resistor is formed in the second layer and above the circuit formed in the first layer.

11. The pressure sensor according to claim 10, wherein a shield layer made of aluminum and connected to the resistor is formed in the second layer at a position immediately above a plurality of semiconductor elements in the circuit to be formed in the first layer.

12. The pressure sensor according to claim 8, wherein the shield layer in the second layer is made of polysilicon, and covers a predetermined region located immediately above the plurality of pressure detection elements.

13. A sensor unit comprising:
the pressure sensor according to claim 8;
a housing configured to accommodate the pressure sensor through use of a sealing material;
a diaphragm configured to isolate an inner peripheral portion of the housing from a pressure chamber of which a pressure is to be detected;
a pressure transmission medium filled between the diaphragm and the sensor chip of the pressure sensor;
a terminal group to be electrically connected to the circuit in the sensor chip of the pressure sensor, and
wherein the shield layer is made of aluminum and is connected to the resistor, wherein the shield layer is formed in the second layer and above the circuit formed in the first layer.

14. A sensor unit comprising:
the pressure sensor according to claim 8;
a housing configured to accommodate the pressure sensor through use of a sealing material;
a diaphragm configured to isolate an inner peripheral portion of the housing from a pressure chamber of which a pressure is to be detected;
a pressure transmission medium filled between the diaphragm and the sensor chip of the pressure sensor;
a terminal group to be electrically connected to the circuit in the sensor chip of the pressure sensor, and
wherein the shield layer in the second layer is made of polysilicon, and covers a predetermined region located immediately above the plurality of pressure detection elements.

15. A pressure sensor comprising:
a sensor chip comprising:
a main body comprising:
a fixed portion formed on a glass layer;
a movable portion integrally formed with the fixed portion, the movable portion being displaceable in response to pressure acting thereon; and
a plurality of pressure detection elements positioned on the main body;
a circuit layer laminated on the main body, the circuit layer having a circuit formed therein that is electrically connected to the pressure detection elements through a conductive element;
a shield layer laminated on the circuit layer, the shield layer having an opening extending therethrough directly above the movable portion, wherein the shield layer is formed continuously around the opening; and
a capacitor formed between the shield layer and one of: an output voltage line and a ground line; and
a resistor connected between the shield layer and the other one of the output voltage line and the ground line, the resistor having a resistance value greater than or equal to 10Ω and less than or equal to 1 MΩ.

* * * * *